(12) United States Patent
Kim et al.

(10) Patent No.: US 10,459,278 B2
(45) Date of Patent: Oct. 29, 2019

(54) DISPLAY DEVICE AND METHOD OF MANUFACTURING THE SAME

(71) Applicant: LG DISPLAY CO., LTD., Seoul (KR)

(72) Inventors: Junghoon Kim, Seoul (KR); Yoochul Sung, Seoul (KR); Yeonock Ha, Paju-si (KR); Byounghee Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/854,444

(22) Filed: Dec. 26, 2017

(65) Prior Publication Data

US 2018/0188595 A1 Jul. 5, 2018

(30) Foreign Application Priority Data

Dec. 29, 2016 (KR) ........................ 10-2016-0182537

(51) Int. Cl.
| | |
|---|---|
| *G02F 1/1335* | (2006.01) |
| *G02F 1/1333* | (2006.01) |
| *H01L 51/00* | (2006.01) |
| *G02F 1/1362* | (2006.01) |
| *H01L 27/32* | (2006.01) |
| *G02F 1/1337* | (2006.01) |

(52) U.S. Cl.
CPC ...... *G02F 1/133514* (2013.01); *G02F 1/1362* (2013.01); *G02F 1/133305* (2013.01); *H01L 51/0011* (2013.01); *G02F 1/133753* (2013.01); *G02F 2001/13625* (2013.01); *G02F 2001/133354* (2013.01); *H01L 27/3244* (2013.01)

(58) Field of Classification Search
CPC ... G02F 1/133354; G02F 2001/133354; H01L 51/0011
See application file for complete search history.

(56) References Cited

U.S. PATENT DOCUMENTS

2006/0290841 A1\* 12/2006 Kwon ............... G02F 1/133512
349/110
2017/0192320 A1\* 7/2017 Wang ............... G02F 1/136209

FOREIGN PATENT DOCUMENTS

JP 04294329 A \* 10/1992

\* cited by examiner

*Primary Examiner* — Jessica M Merlin
(74) *Attorney, Agent, or Firm* — Seed IP Law Group LLP

(57) ABSTRACT

A display device and a method of manufacturing the same are disclosed. The display device includes a lower substrate, subpixels positioned on the lower substrate, and a fine alignment key positioned in at least one of the subpixels. The method of manufacturing the display device includes forming an alignment key outside a target substrate and forming a fine alignment key inside an active area defined as a display area on the target substrate, aligning the target substrate and a mask substrate using the alignment key and the fine alignment key, and performing an exposure operation using the target substrate and the mask substrate.

18 Claims, 16 Drawing Sheets

DISPLAY DEVICE AND METHOD OF MANUFACTURING THE SAME

CROSS-REFERENCE TO RELATED APPLICATION

This application claims the benefit of Korean Patent Application No. 10-2016-0182537 filed on Dec. 29, 2016, which is incorporated herein by reference for all purposes as if fully set forth herein.

BACKGROUND

Technical Field

The present disclosure relates to a display device and a method of manufacturing the same.

Description of the Related Art

With the development of information technology, the market of display devices used as a connection medium between a user and information is growing. Thus, the use of display devices, such as an organic light emitting diode (OLED) display, a liquid crystal display (LCD), and a plasma display panel (PDP), is on the rise.

Some of the display devices, for example, the liquid crystal display or the OLED display include a display panel including a plurality of subpixels arranged in a matrix and a driver for driving the display panel. The driver includes a gate driver supplying a gate signal (or referred to as "scan signal") to the display panel, a data driver supplying a data signal to the display panel, and the like.

When the gate signal, the data signal, etc. are supplied to the subpixels arranged in the matrix, selected subpixels of the display device emit light and can display an image. Further, the display panel includes thin film structures such as signal lines and power lines, in addition to the subpixels.

In order to form the thin-film structures, a process for aligning a mask substrate and a target substrate, an exposure process, a development process, an etching process, and the like have to be performed. In a related art, when a large-sized display device was manufactured, a mask substrate and a target substrate could be aligned based on an alignment key disposed outside the target substrate. However, when an ultra-large display device was manufactured in accordance with the related art, there were difficulties in aligning the mask substrate and the target substrate, designing the exposure, and the like. Thus, there is a need to address the difficulties.

BRIEF SUMMARY

In one embodiment, the present disclosure provides a display device including a lower substrate, subpixels, and a fine alignment key. The subpixels are positioned on the lower substrate. The fine alignment key is positioned in at least one of the subpixels.

In another embodiment, the present disclosure provides a method of manufacturing a display device including forming an alignment key outside a target substrate and forming a fine alignment key inside an active area defined as a display area on the target substrate, aligning the target substrate and a mask substrate using the alignment key and the fine alignment key, and performing an exposure operation using the target substrate and the mask substrate.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments of the present disclosure, examples of which are illustrated in the accompanying drawings. Wherever convenient for explanation of the embodiments provided herein, the same reference numbers will be used throughout the drawings to refer to the same or like parts. In the present disclosure, a detailed description of known components or functionalities may be omitted if it is determined that a detailed description of such known components or functionalities may mislead or otherwise obscure the description of the embodiments of the present disclosure.

With the development of information technology, the market of display devices used as a connection medium between a user and information is growing. Thus, the use of display devices, such as an organic light emitting diode (OLED) display, a liquid crystal display (LCD), and an electrophoresis display, is on the rise.

Each of the liquid crystal display, the OLED display, and the electrophoresis display includes a display panel including a plurality of subpixels arranged in a matrix and a driver for driving the display panel. The driver includes a gate driver supplying a gate signal (or referred to as "scan signal") to the display panel, a data driver supplying a data signal to the display panel, and the like. When the gate signal, the data signal, etc. are supplied to the subpixels of the display device, selected subpixels emit light and can display an image.

In the following description, embodiments of the disclosure will be described using the liquid crystal display as an example of the display device. However, embodiments are not limited thereto. For example, all of display devices (for example, the OLED display and the electrophoresis display) including thin film structures formed using a mask substrate may be used. Further, embodiments of the disclosure will be described using an embedded gate driver as an example. However, embodiments are note limited thereto.

Figure 1:
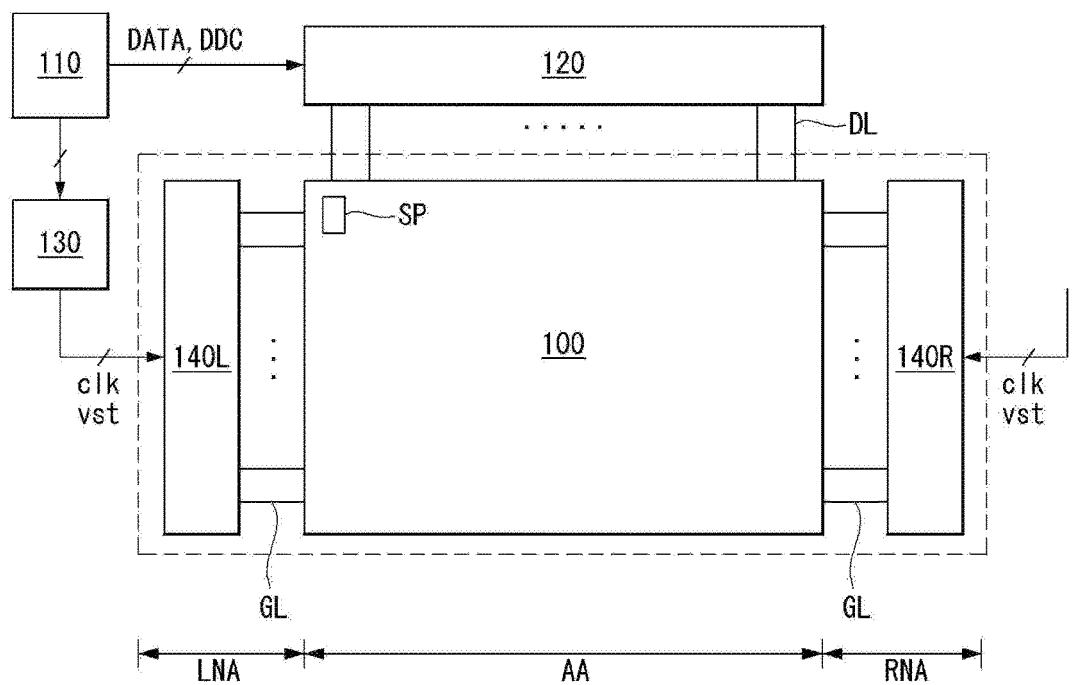
FIG. 1 is a schematic block diagram of a display device.
Figure 2:
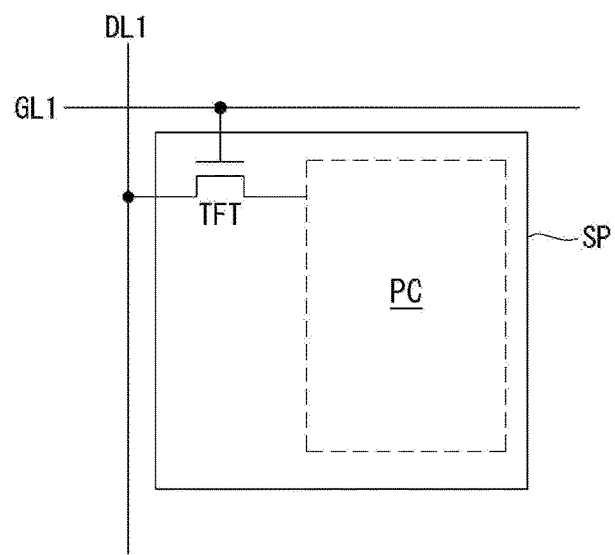
FIG. 2 illustrates an example of configuration of a subpixel shown in FIG. 1.
Figure 3:
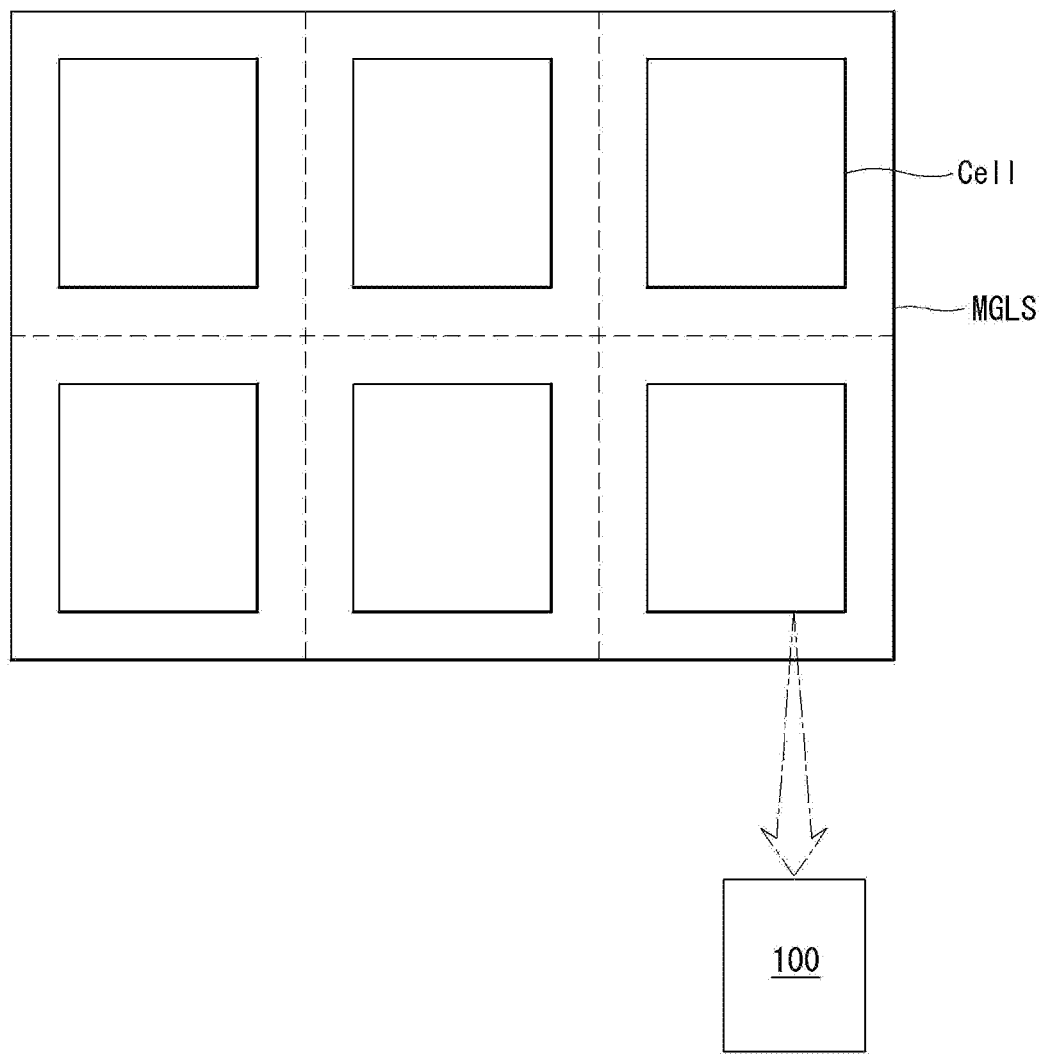
FIG. 3 schematically illustrates a method of fabricating a display panel.
Figure 4:
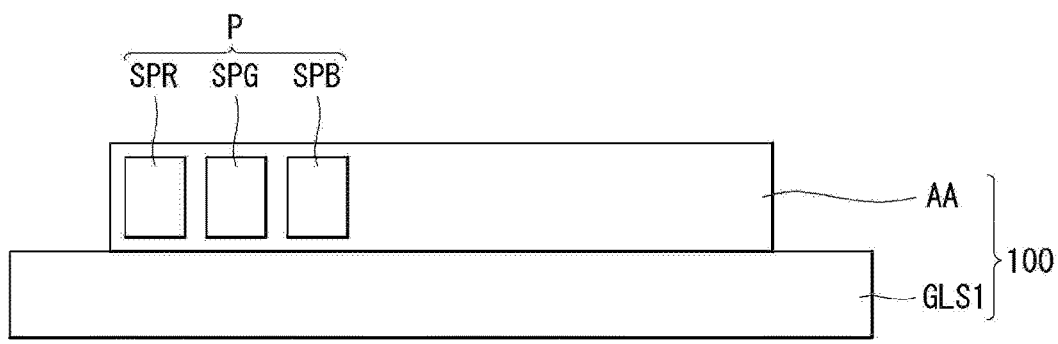
FIG. 4 schematically illustrates a cross section of a display panel.

FIG. 1 is a schematic block diagram of a display device. FIG. 2 illustrates an example of configuration of a subpixel shown in FIG. 1. FIG. 3 schematically illustrates a method of fabricating a display panel. FIG. 4 schematically illustrates a cross section of a display panel.

As shown in FIGS. 1 and 2, a display device includes a display panel 100, a timing controller 110, a data driver 120, and embedded gate drivers 130, 140L, and 140R.

The timing controller 110 receives timing signals, such as a vertical sync signal, a horizontal sync signal, a data enable signal, and a dot clock, through a low-voltage differential signaling (LVDS) interface receiving circuit connected to an image board or a transition minimized differential signaling (TMDS) interface receiving circuit connected to the image board, and the like. The timing controller 110 generates timing control signals for controlling operation timings of the data driver 120 and the embedded gate drivers 130, 140L, and 140R based on the received timing signals.

The data driver 120 includes a plurality of source driver integrated circuits (ICs). The source driver ICs receive a data signal DATA and a source timing control signal DDC from the timing controller 110. The source driver ICs convert the data signal DATA from a digital signal to an analog signal in response to the source timing control signal DDC and supply the analog signal to data lines DL of the display panel 100. The source driver ICs may be connected to the data lines DL of the display panel 100 by a chip-on glass (COG) process or a tape automated bonding (TAB) process. However, embodiments are note limited thereto.

The embedded gate drivers 130, 140L, and 140R include a level shifter 130 and shift registers 140L and 140R. The level shifter 130 is formed as an IC and disposed on an external substrate connected to the display panel 100. The level shifter 130 shifts levels of signals clk and vst and electric power supplied through a clock signal line, a start signal line, a high potential power line, and a low potential power line under the control of the timing controller 110 and then supplies them to the shift registers 140L and 140R.

The shift registers 140L and 140R are embedded in the display panel 100 through a gate-in panel (GIP) method. The shift registers 140L and 140R generate a gate signal based on the signals clk and vst and the electric power and output the gate signal to gate lines GL of the display panel 100. The shift registers 140L and 140R include stage circuits, each of which is formed as a thin film transistor, in non-display areas LNA and RNA of the display panel 100. The stage circuits are dividedly disposed in the left non-display area LNA and the right non-display area RNA of the display panel 100. The stage circuits include first to nth stage circuits, where n is an integer equal to or greater than 10.

The display panel 100 includes subpixels dividedly connected to the data lines DL and the gate lines GL intersecting each other. The display panel 100 includes a display area AA in which the subpixels are formed, and the non-display areas LNA and RNA, positioned outside the display area AA, in which various signal lines or pads are formed.

As shown in FIG. 2, one subpixel SP includes a thin film transistor TFT connected to a first gate line GL1 and a first data line DL1 and a pixel circuit PC operating in response to the data signal DATA supplied in response to the gate signal supplied through the thin film transistor TFT. The pixel circuit PC includes a storage capacitor storing a data voltage, and the like.

When the display panel 100 is configured as a liquid crystal display panel, the display panel 100 is implemented in a twisted nematic (TN) mode, a vertical alignment (VA) mode, an in-plane switching (IPS) mode, a fringe field switching (FFS) mode, or an electrically controlled birefringence (ECB) mode. When the display panel 100 is configured as an OLED display panel, the display panel 100 is implemented as a top emission type, a bottom emission type, or a dual emission type.

As shown in FIGS. 3 and 4, the display panel 100 is manufactured by dividing a target substrate (or a mother substrate) MLGS on a per cell basis. After a cutting process is performed on the target substrate divided on a per cell basis, each cell serves as the individual display panel 100.

The display panel 100 cut on a per cell basis is roughly divided into a lower substrate GLS1 and the display area (or an active area) AA. Because the display area AA on the lower substrate GLS1 is susceptible to moisture or oxygen, an encapsulation process for encapsulating the display area AA is performed. The display area AA may be a pixel group including red subpixels SPR, green subpixels SPG, and blue subpixels SPB.

The display panel 100 includes thin-film structures such as signal lines and power lines, in addition to the subpixels. In order to form the thin-film structures, a process for forming thin films on the target substrate, a process for laminating a dry film (or a film type photoresist) or coating a liquid photoresist, a process for aligning a mask substrate and a target substrate, an exposure process, a development process, an etching process, and the like have to be performed.

<First Embodiment>

Figure 5:
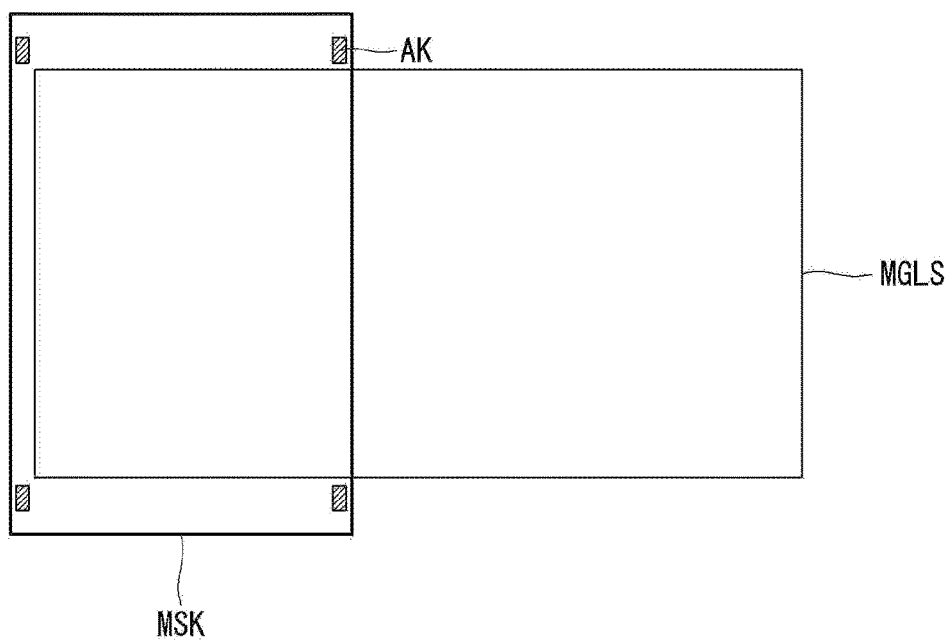
FIG. 5 schematically illustrates a method of aligning a mask substrate and a target substrate according to a related art.
Figure 6:
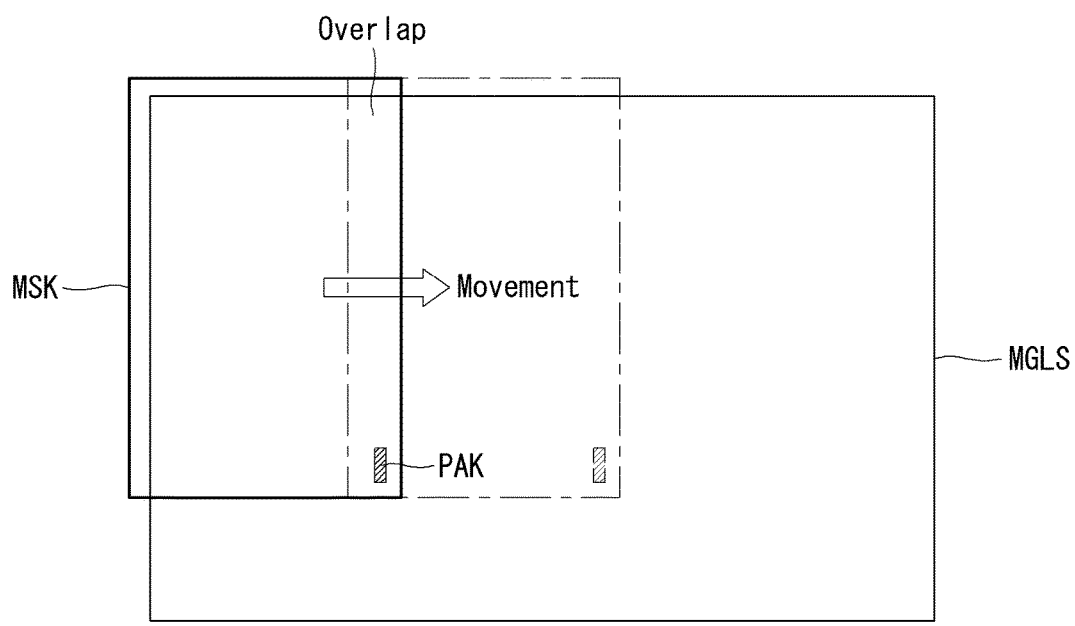
FIG. 6 schematically illustrates a method of aligning a mask substrate and a target substrate according to a first embodiment of the disclosure.

FIG. 5 schematically illustrates a method of aligning a mask substrate and a target substrate according to a related art. FIG. 6 schematically illustrates a method of aligning a mask substrate and a target substrate according to a first embodiment of the disclosure.

As shown in FIG. 5, in the related art, when a large-sized display device was manufactured, a mask substrate MSK and a target substrate MGLS could be aligned based on an alignment key AK disposed outside the target substrate MGLS. However, when an ultra-large display device was manufactured in accordance with the related art, there were difficulties in aligning the mask substrate MSK and the target substrate MGLS, designing the exposure, and the like.

As shown in FIG. 6, in the first embodiment of the disclosure, when an ultra-large display device is manufactured, a fine alignment key PAK is formed inside (i.e., inside a cell where a display area of a display panel will occupy) a target substrate MGLS, in order to easily and accurately align a mask substrate MSK and the target substrate MGLS.

The fine alignment key PAK is used to align the mask substrate MSK and the target substrate MGLS together with an alignment key disposed outside the target substrate MGLS. The fine alignment key PAK is not on a portion which is cut by a cutting process and is not removed, rather, it is disposed inside the display area of the display panel.

The first embodiment of the disclosure can overlap and expose the mask substrate MSK with a mask substrate used in a previous shot while moving the mask substrate MSK to the left, right, upper, and lower sides based on the fine alignment key PAK. Therefore, as shown in FIG. 6, a position of the fine alignment key PAK is not limited to any one position of the target substrate MGLS and may be variously changed depending on the number of shots, an overlap position, a size of the cell, an exposure method, and the like, if necessary or desired.

The fine alignment key PAK according to the first embodiment of the disclosure may be formed of a material used to form thin films. For example, the fine alignment key PAK may be formed of one of a metal material, an organic material, an inorganic material, and an organic-inorganic hybrid material, or a combination thereof. The fine alignment key PAK according to the first embodiment of the disclosure can form a four-point alignment structure (or a multi-point alignment structure) together with the alignment key disposed outside the target substrate MGLS.

A fine alignment key according to a second embodiment of the disclosure is described in detail below.

<Second Embodiment>

FIGS. 7 to 12 illustrate a fine alignment key according to a second embodiment of the disclosure.

Figure 7:
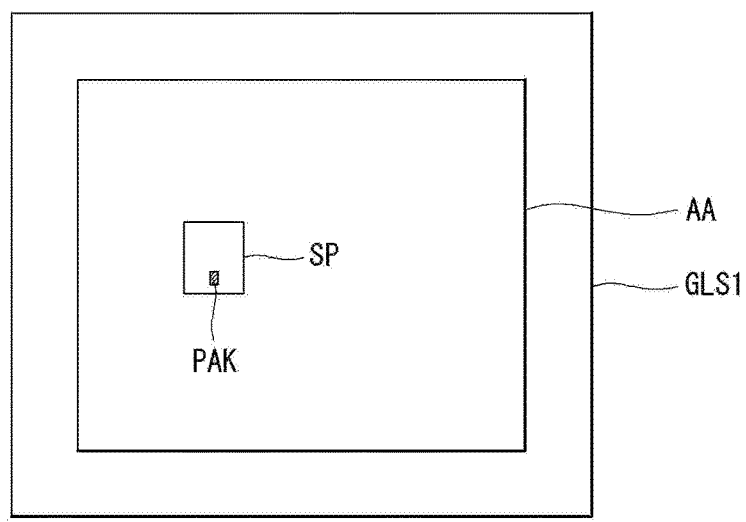
FIGS. 7 to 12 illustrate a fine alignment key according to a second embodiment of the disclosure.

As shown in FIG. 7, a fine alignment key PAK may be formed solely on a lower substrate GLS1 constituting a display panel 100. The fine alignment key PAK may be disposed inside a subpixel SP positioned at any one position inside a display area AA.

The fine alignment key PAK may be formed solely on a target substrate in a manufacturing process of the display panel 100. However, the target substrate, on which a thin film process has been completed, is cut on a per cell basis by a cutting process. Because of this, as shown in FIG. 7, the fine alignment key PAK may be present inside a subpixel SP positioned at any one position inside a display area AA of a specific display panel 100.

Figure 8:
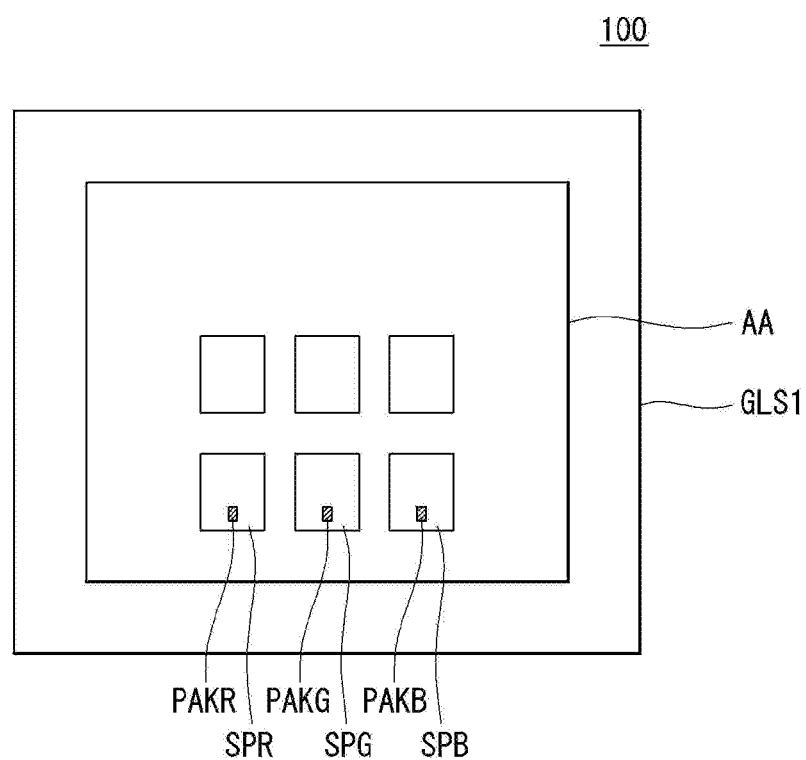

As shown in FIG. 8, a plurality of fine alignment keys PAKR, PAKG and PAKB may be formed on the lower substrate GLS1 constituting the display panel 100. The fine alignment keys PAKR, PAKG and PAKB may be respectively disposed inside a red subpixel SPR, a green subpixel SPG, and a blue subpixel SPB positioned inside the display area AA.

The plurality of fine alignment keys PAKR, PAKG and PAKB may be formed on the target substrate in the manufacturing process of the display panel 100. However, the target substrate, on which the thin film process has been completed, is cut on a per cell basis by the cutting process. Because of this, as shown in FIG. 8, the fine alignment keys PAKR, PAKG and PAKB may be respectively present inside a red subpixel SPR, a green subpixel SPG, and a blue subpixel SPB positioned at any one position inside a display area AA of a specific display panel 100.

The fine alignment keys PAKR, PAKG and PAKB may be divided into a red fine alignment key PAKR, a green fine alignment key PAKG, and a blue fine alignment key PAKB. When the fine alignment keys PAKR, PAKG and PAKB are dividedly disposed as described above, the red fine alignment key PAKR, the green fine alignment key PAKG, and the blue fine alignment key PAKB can be selectively aligned with a red mask substrate, a green mask substrate, and a blue mask substrate which are divided depending on a material to be deposited. For example, the red mask substrate, the green mask substrate, and the blue mask substrate may be used to align the mask substrate and the target substrate, in order to form red, green, and blue color filter layers on the target substrate. However, embodiments are not limited thereto. There may be various different masks that might be aligned with the red key, the blue key or the green key.

Figure 9:
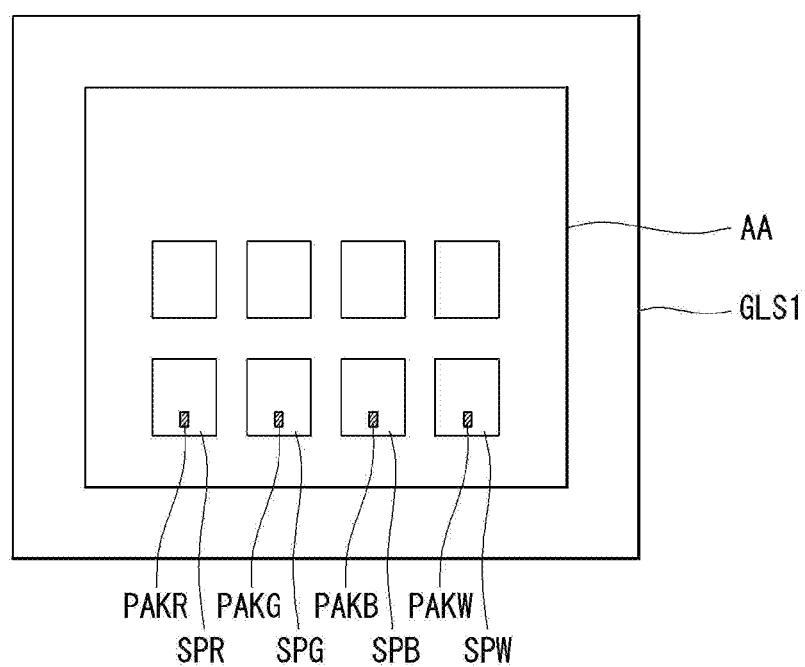

As shown in FIG. 9, a plurality of fine alignment keys PAKR, PAKG, PAKB and PAKW may be formed on the lower substrate GLS1 constituting the display panel 100. The fine alignment keys PAKR, PAKG, PAKB and PAKW may be respectively disposed inside a red subpixel SPR, a green subpixel SPG, a blue subpixel SPB, and a white subpixel SPW positioned inside the display area AA.

The plurality of fine alignment keys PAKR, PAKG, PAKB and PAKW may be formed on the target substrate in the manufacturing process of the display panel 100. However, the target substrate, on which the thin film process has been completed, is cut on a per cell basis by the cutting process. Because of this, as shown in FIG. 9, the fine alignment keys PAKR, PAKG, PAKB and PAKW may be respectively present inside a red subpixel SPR, a green subpixel SPG, a blue subpixel SPB, and a white subpixel SPW positioned at any one position inside a display area AA of a specific display panel 100.

The fine alignment keys PAKR, PAKG, PAKB and PAKW may be divided into a red fine alignment key PAKR, a green fine alignment key PAKG, a blue fine alignment key PAKB, and a white fine alignment key PAKW. When the fine alignment keys PAKR, PAKG, PAKB and PAKW are dividedly disposed as described above, the red fine alignment key PAKR, the green fine alignment key PAKG, the blue fine alignment key PAKB, and the white fine alignment key PAKW can be selectively aligned with a red mask substrate, a green mask substrate, a blue mask substrate, and a white mask substrate which are divided depending on a material to be deposited.

Figure 10:
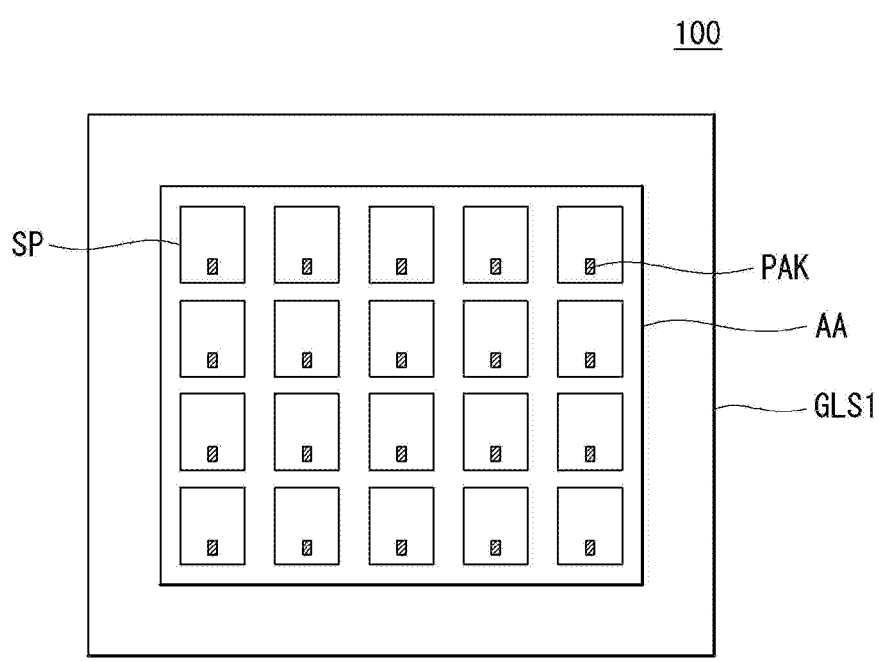

As shown in FIG. 10, a plurality of fine alignment keys PAK may be formed on the lower substrate GLS1 constituting the display panel 100. The plurality of fine alignment keys PAK may be disposed inside all the subpixels SP positioned inside the display area AA.

The plurality of fine alignment keys PAK may be formed on the target substrate in the manufacturing process of the display panel 100. Because of this, as shown in FIG. 10, the fine alignment keys PAK may be present inside all the subpixels SP positioned inside the display area AA of the display panel 100.

Figure 11:
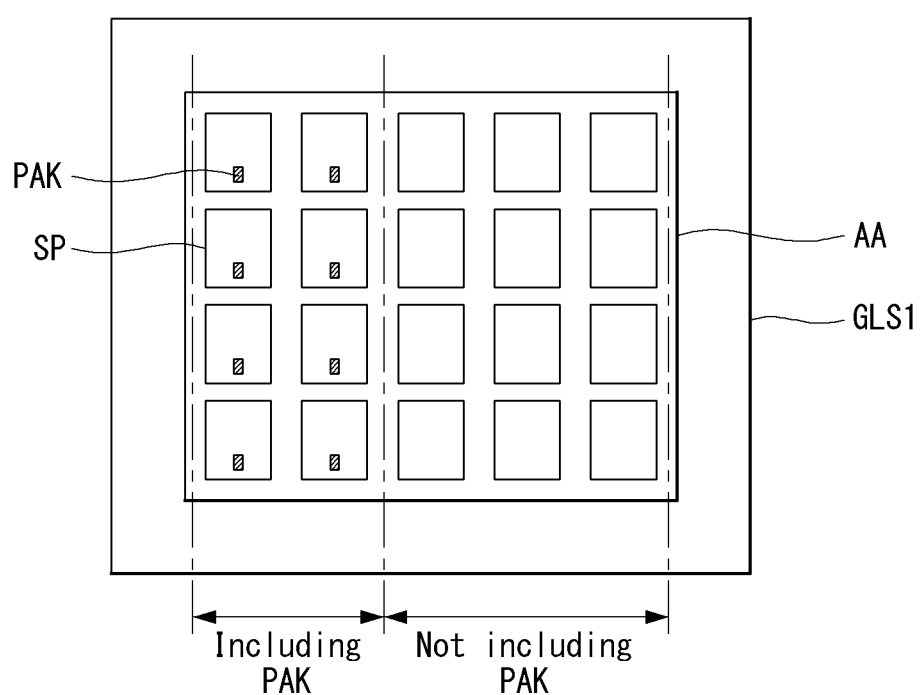

As shown in FIG. 11, a plurality of fine alignment keys PAK may be formed on the lower substrate GLS1 constituting the display panel 100. The plurality of fine alignment keys PAK may be disposed inside only subpixels SP positioned on one side (for example, the left side or the right side) of the display area AA.

When the fine alignment keys PAK according to the embodiment of the disclosure are used as described above, the mask substrates can be overlapped each other in a horizontal direction (i.e., a left-right direction) and exposed. Therefore, when the mask substrates are overlapped and exposed in the horizontal direction, the fine alignment keys PAK may be present inside only the subpixels SP positioned on one side (for example, the left side or the right side) of the display area AA of the display panel 100, as shown in FIG. 11.

Figure 12:
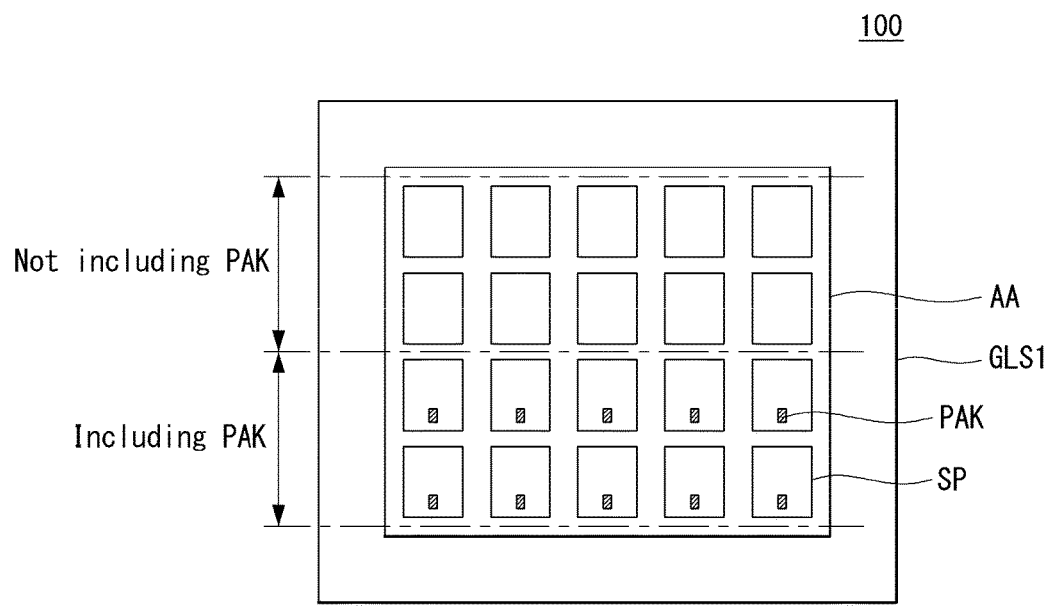

As shown in FIG. 12, a plurality of fine alignment keys PAK may be formed on the lower substrate GLS1 constituting the display panel 100. The plurality of fine alignment keys PAK may be disposed inside only subpixels SP positioned on one side (for example, the upper side or the lower side) of the display area AA.

When the fine alignment keys PAK according to the embodiment of the disclosure are used as described above, the mask substrates can be overlapped each other in a vertical direction (i.e., an up-down direction) and exposed. Therefore, when the mask substrates are overlapped and exposed in the vertical direction, the fine alignment keys PAK may be present inside only the subpixels SP positioned on one side (for example, the upper side or the lower side) of the display area AA of the display panel 100, as shown in FIG. 12.

<Third Embodiment>

A subpixel including a fine alignment key according to a third embodiment of the disclosure is described in detail below.

Figure 13:
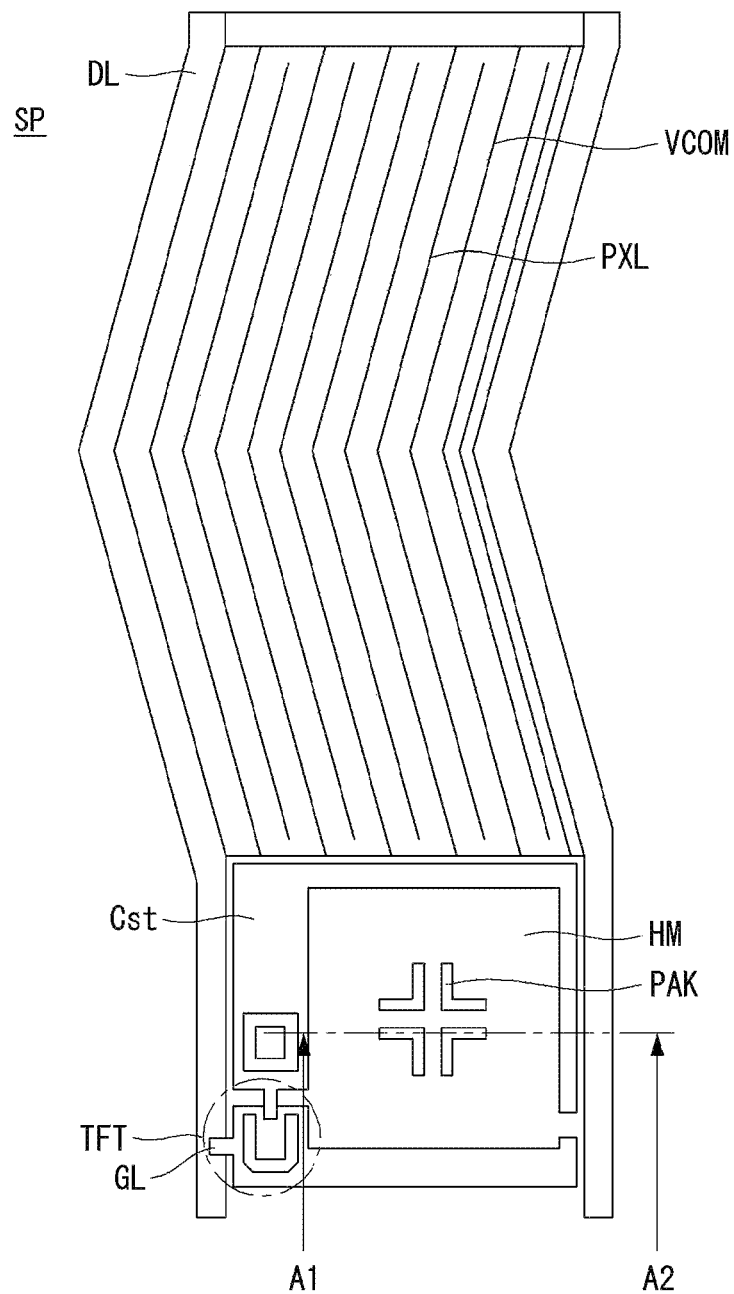
FIG. 13 is a plan view of a subpixel including a fine alignment key according to a third embodiment of the disclosure.
Figure 14:
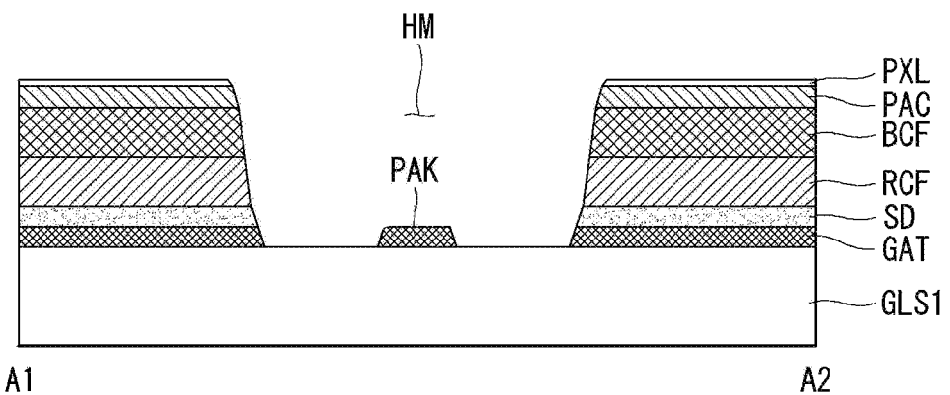
FIG. 14 is a cross-sectional view taken along line A1-A2 of FIG. 13.

FIG. 13 is a plan view of a subpixel including a fine alignment key according to a third embodiment of the disclosure. FIG. 14 is a cross-sectional view taken along line A1-A2 of FIG. 13.

As shown in FIG. 13, a fine alignment key PAK according to the third embodiment of the disclosure is disposed in a non-opening of a subpixel SP. A pixel electrode layer PXL and a common electrode layer VCOM are disposed in an opening. Light is emitted from the opening location. A thin film transistor TFT, a storage capacitor Cst, and a keyhole HM are disposed in the non-opening.

The fine alignment key PAK is disposed adjacent to the thin film transistor TFT and the storage capacitor Cst of the subpixel SP. The fine alignment key PAK is disposed inside the keyhole HM surrounded by an electrode constituting the storage capacitor Cst.

As shown in FIGS. 13 and 14, the fine alignment key PAK is disposed on a lower substrate GLS1 provided inside the keyhole HM. The fine alignment key PAK is spaced apart from another structure and is formed thus an an island. It can be considered to have an island type structure or a floating shape, namely, the fine alignment key PAK is spaced apart from other structures that are on the same layer, as can be seen in FIG. 14. FIG. 13 illustrates the cross-shaped fine alignment key PAK, by way of example. However, embodiments are not limited thereto, and the fine alignment key PAK may be formed in various shapes.

A gate metal layer GAT, a source drain metal layer SD, a first color filter layer RCF, a second color filter layer BCF, a planarization layer PAC, and a pixel electrode layer PXL are deposited on the lower substrate GLS1 in the order named. The gate metal layer GAT is a metal layer constituting a gate electrode of the thin film transistor TFT. The source drain metal layer SD is a metal layer constituting a source electrode and a drain electrode of the thin film transistor TFT. The first color filter layer RCF is a color filter layer having a first color (for example, red), and the second color filter layer BCF is a color filter layer having a second color (for example, blue). The planarization layer PAC is an insulating layer for planarizing the surface. The pixel electrode layer PXL is an electrode for forming an electric field based on a pixel voltage applied from the thin film transistor TFT.

As described above, the fine alignment key PAK is disposed on the lower substrate GLS1 provided by the keyhole HM. The fine alignment key can be formed of the same material and at the same time as the gate metal layer. However, a buffer layer may be further positioned under the fine alignment key PAK. Namely, the keyhole HM may be formed to expose the lower substrate GLS1, or may be patterned and/or etched so that the buffer layer is exposed, thereby forming a hole that is more depressed than the periphery. The hole may also be referred to as a recess, a groove, a depression or other term indicating that it is lower than the region around it. The fine alignment key PAK may be formed as a single layer or multiple layers using one of materials constituting the gate metal layer GAT, the source drain metal layer SD, the first color filter layer RCF, the second color filter layer BCF, the planarization layer PAC, and the pixel electrode layer PXL, or a combination thereof. In order to provide a greater height difference between the fine alignment key PAK and the material around the key, the various layers may be deposited on top of each other and not etched during the various pattern and etching steps. For example, in the light emitting portion of the pixel, a RCF and BCF will not be positioned on top of each of. Similarly, the metal for the source and drain electrodes will not normally be directly on the gate metal at those locations where a transistor is formed and electrically active. However, in that region of a pixel in which there are not active structures and no light is emitted, all of these layers, up to 3 or 4 color filter layers, in one example, can be stacked on top of each other provide a deeper relative recess for the fine alignment key and thus have it more distinctive and easier to focus on during alignment.

FIGS. 13 and 14 schematically illustrate an example of the structure of the subpixel including the above-described fine alignment key PAK. However, embodiments are not limited thereto. For example, a planar structure of the subpixel and a structure of the layers constituting the subpixel may be changed depending on the manufacturing method of the display panel.

<Fourth Embodiment>

Figure 15:
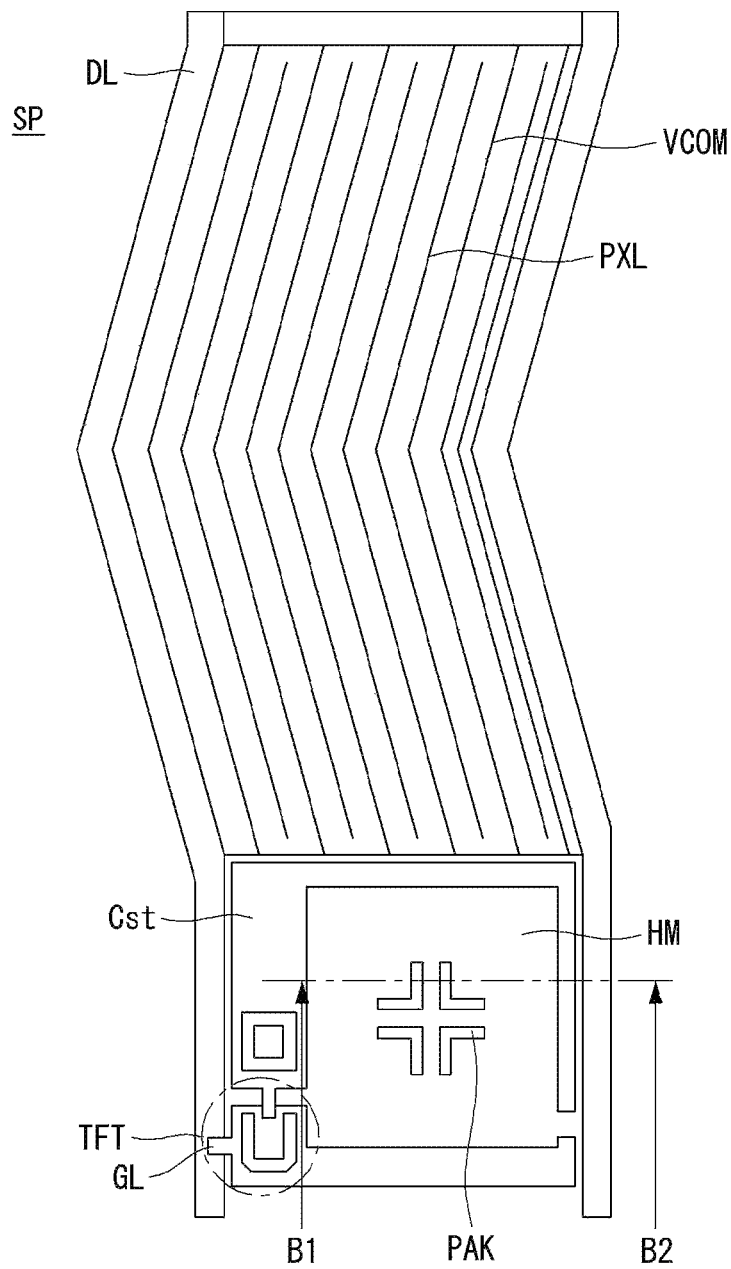
FIG. 15 is a plan view of a subpixel including a fine alignment key according to a fourth embodiment of the disclosure.
Figure 16:
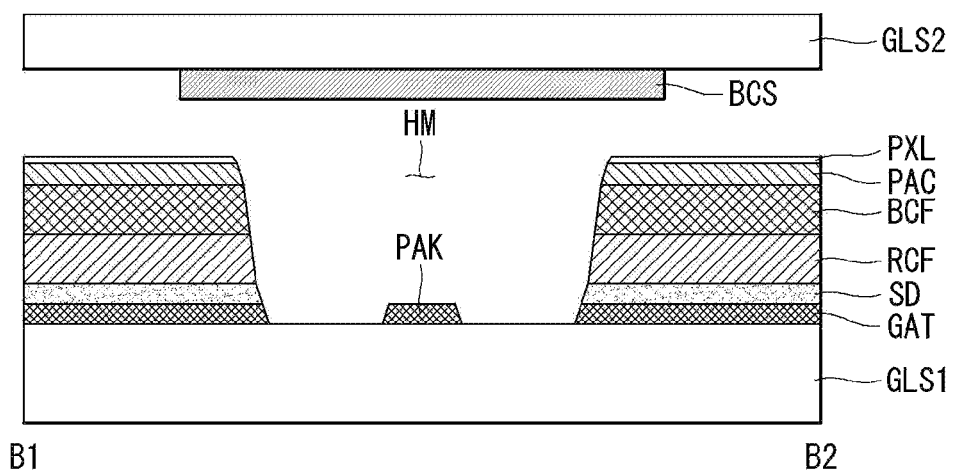
FIG. 16 is a cross-sectional view taken along line B1-B2 of FIG. 15.

FIG. 15 is a plan view of a subpixel including a fine alignment key according to a fourth embodiment of the disclosure. FIG. 16 is a cross-sectional view taken along line B1-B2 of FIG. 15.

As shown in FIG. 15, a fine alignment key PAK according to the fourth embodiment of the disclosure is disposed in a non-opening of a subpixel SP. A pixel electrode layer PXL and a common electrode layer VCOM are disposed in an opening, and a thin film transistor TFT, a storage capacitor Cst, and a keyhole HM are disposed in the non-opening.

The fine alignment key PAK is disposed adjacent to the thin film transistor TFT and the storage capacitor Cst of the subpixel SP. The fine alignment key PAK is disposed inside the keyhole HM surrounded by an electrode constituting the storage capacitor Cst.

As shown in FIGS. 15 and 16, the fine alignment key PAK is disposed on a lower substrate GLS1 provided inside the keyhole HM. The fine alignment key PAK is spaced apart from another structure and is formed in an island shape (or a floating shape). FIG. 15 illustrates the cross-shaped fine alignment key PAK, by way of example. However, embodiments are not limited thereto, and the fine alignment key PAK may be formed in various shapes.

A gate metal layer GAT, a source drain metal layer SD, a first color filter layer RCF, a second color filter layer BCF, a planarization layer PAC, and a pixel electrode layer PXL are deposited on the lower substrate GLS1 in the order named. The gate metal layer GAT is a metal layer constituting a gate electrode of the thin film transistor TFT, and the source drain metal layer SD is a metal layer constituting a source electrode and a drain electrode of the thin film transistor TFT. The first color filter layer RCF is a color filter layer having a first color (for example, red), and the second color filter layer BCF is a color filter layer having a second color (for example, blue). The planarization layer PAC is an insulating layer for planarizing the surface. The pixel electrode layer PXL is an electrode for forming an electric field based on a pixel voltage applied from the thin film transistor TFT.

As described above, the fine alignment key PAK is disposed on the lower substrate GLS1 provided by the keyhole HM. However, a buffer layer may be further positioned under the fine alignment key PAK. The fine alignment key PAK may be formed as a single layer or multiple layers using one of materials constituting the gate metal layer GAT, the source drain metal layer SD, the first color filter layer RCF, the second color filter layer BCF, the planarization layer PAC, and the pixel electrode layer PXL, or a combination thereof.

FIGS. 15 and 16 schematically illustrate an example of the above-described fine alignment key PAK and the structure of the subpixel including the fine alignment key PAK. However, embodiments are not limited thereto. For example, a structure of the layers constituting the subpixel may be changed depending on the manufacturing method of the display panel.

The structure in which the color filter layers RCF and BCF are formed on the lower substrate GLS1 causes light provided by a backlight unit disposed under the display panel to prevent a leakage of light emitted from the non-opening.

However, as the keyhole HM is disposed so as to form the fine alignment key PAK, a light leakage of a corresponding area may be caused. The fine alignment key PAK is in a floating state because of material characteristics of the fine alignment key PAK, but an electric field may be formed in the corresponding area. Hence, a liquid crystal layer may react.

A black-based light leakage prevention layer BCS formed on an upper substrate GLS2 functions to prevent the above problems. The light leakage prevention layer BCS may be formed in a tetragonal or polygonal island shape corresponding to the keyhole HM.

The light leakage prevention layer BCS may have a size corresponding to the keyhole HM, or may be formed in a stripe shape or a net shape in order to completely cover the non-opening. The upper substrate GLS2 is positioned opposite the lower substrate GLS1. The lower substrate GLS1 and the upper substrate GLS2 are attached and sealed by an adhesive member.

<Fifth Embodiment>

Figure 17:
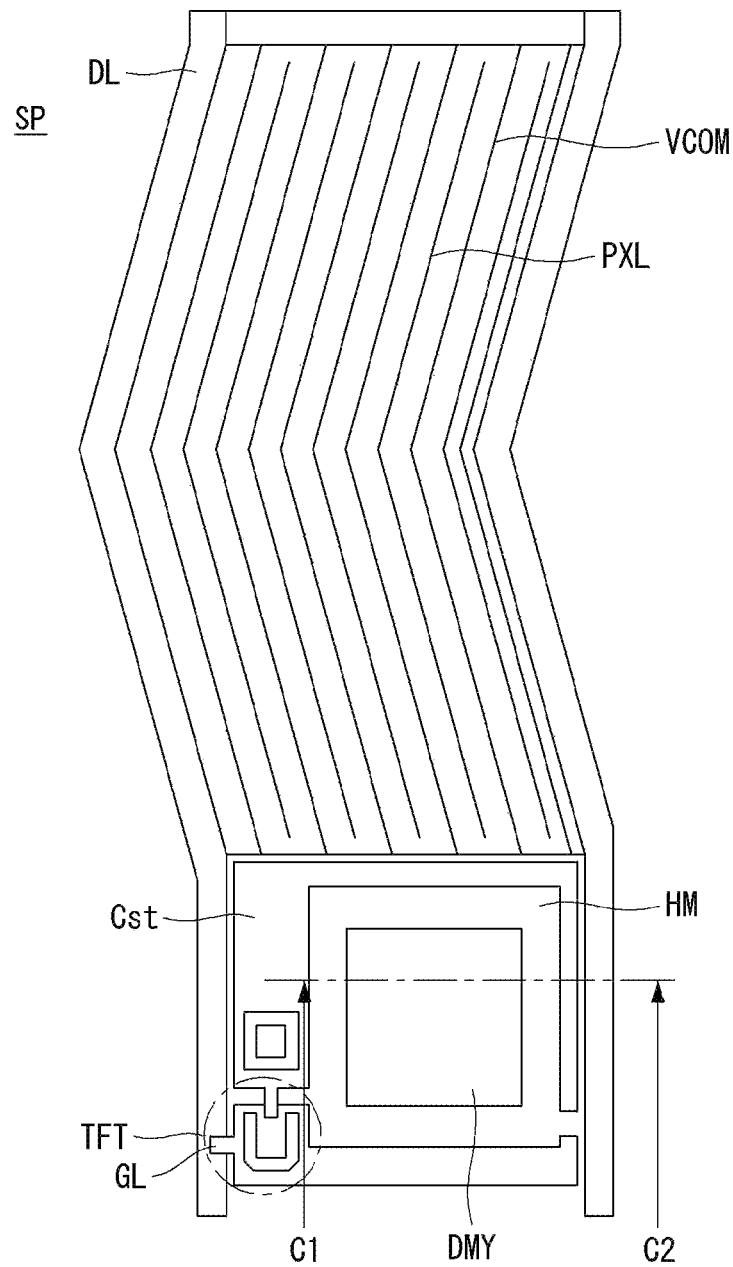
FIG. 17 is a plan view of a subpixel not including a fine alignment key according to a fifth embodiment of the disclosure.
Figure 18:
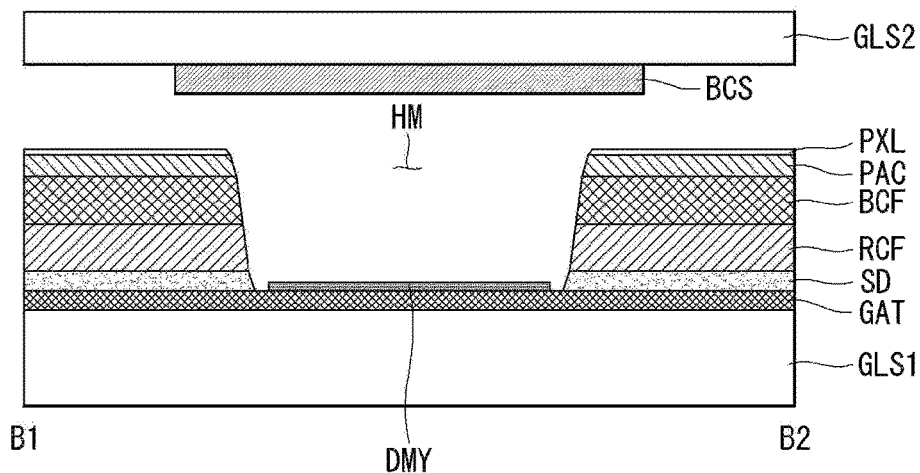
FIG. 18 is a cross-sectional view taken along line C1-C2 of FIG. 17.

FIG. 17 is a plan view of a subpixel not including a fine alignment key according to a fifth embodiment of the disclosure. FIG. 18 is a cross-sectional view taken along line C1-C2 of FIG. 17.

As shown in FIG. 17, a fine dummy pattern DMY is disposed in a non-opening of a subpixel SP not including a fine alignment key according to the fifth embodiment of the disclosure. A pixel electrode layer PXL and a common electrode layer VCOM are disposed in an opening, and a thin film transistor TFT, a storage capacitor Cst, and a keyhole HM are disposed in the non-opening.

The fine dummy pattern DMY is disposed adjacent to the thin film transistor TFT and the storage capacitor Cst of the subpixel SP. The fine dummy pattern DMY is disposed inside the keyhole HM surrounded by an electrode constituting the storage capacitor Cst.

As shown in FIGS. 17 and 18, the fine dummy pattern DMY is disposed on a lower substrate GLS1 provided inside the keyhole HM. The fine dummy pattern DMY is spaced apart from another structure and is formed in an island shape (or a floating shape). FIG. 17 illustrates the tetragonal fine dummy pattern DMY, by way of example. However, embodiments are not limited thereto, and the fine dummy pattern DMY may be formed in various shapes.

A gate metal layer GAT, a source drain metal layer SD, a first color filter layer RCF, a second color filter layer BCF, a planarization layer PAC, and a pixel electrode layer PXL are deposited on the lower substrate GLS1 in the order named. The gate metal layer GAT is a metal layer constituting a gate electrode of the thin film transistor TFT, and the source drain metal layer SD is a metal layer constituting a source electrode and a drain electrode of the thin film transistor TFT. The first color filter layer RCF is a color filter layer having a first color (for example, red), and the second color filter layer BCF is a color filter layer having a second color (for example, blue). The planarization layer PAC is an insulating layer for planarizing the surface. The pixel electrode layer PXL is an electrode for forming an electric field based on a pixel voltage applied from the thin film transistor TFT.

As described above, the fine dummy pattern DMY is disposed on the lower substrate GLS1 provided inside the keyhole HM. However, a buffer layer may be further positioned under the fine dummy pattern DMY. The fine dummy pattern DMY may be formed as a single layer or multiple layers using one of materials constituting the gate metal layer GAT, the source drain metal layer SD, the first color filter layer RCF, the second color filter layer BCF, the planarization layer PAC, and the pixel electrode layer PXL, or a combination thereof.

FIG. 17 schematically illustrates an example of the above-described fine dummy pattern DMY and the structure of the subpixel including the fine dummy pattern DMY. However, embodiments are not limited thereto. For example, a structure of the layers constituting the subpixel may be changed depending on the manufacturing method of the display panel.

The fine dummy pattern DMY prevents a height difference between the subpixel including the fine dummy pattern DMY and a subpixel including a fine alignment key from being generated. For example, when a display panel including a liquid crystal layer is manufactured, a rubbing operation for forming a pre-tilt angle of liquid crystals is performed.

However, when a subpixel, in which the keyhole HM not having the fine alignment key exists or there is no keyhole HM, and a subpixel including the fine alignment key coexist, the uniform rubbing operation cannot be performed due to a height difference between the subpixels. For example, there may be a difference in an orientation force between the subpixels in the rubbing operation. In this instance, after the display panel is manufactured, a reduction in the display quality may be caused by a defective rubbing vertical line.

However, the embodiment of the disclosure is configured such that the keyhole HM is formed in each of non-openings of all the subpixels, the fine alignment key is formed in a portion requiring the alignment key, and the fine dummy pattern DMY is formed in a portion not requiring the alignment key. Hence, the embodiment of the disclosure can prevent the problems that may be caused by the height difference between the subpixels.

In addition, a black-based light leakage prevention layer BCS may be formed on an upper substrate GLS2 so that light provided by a backlight unit disposed under the display panel prevents a leakage of light emitted from the non-opening.

The light leakage prevention layer BCS may be formed in a tetragonal or polygonal island shape corresponding to the keyhole HM. The light leakage prevention layer BCS may have a size corresponding to the keyhole HM, or may be formed in a stripe shape or a net shape in order to completely cover the non-opening.

<Sixth Embodiment>

Figure 19:
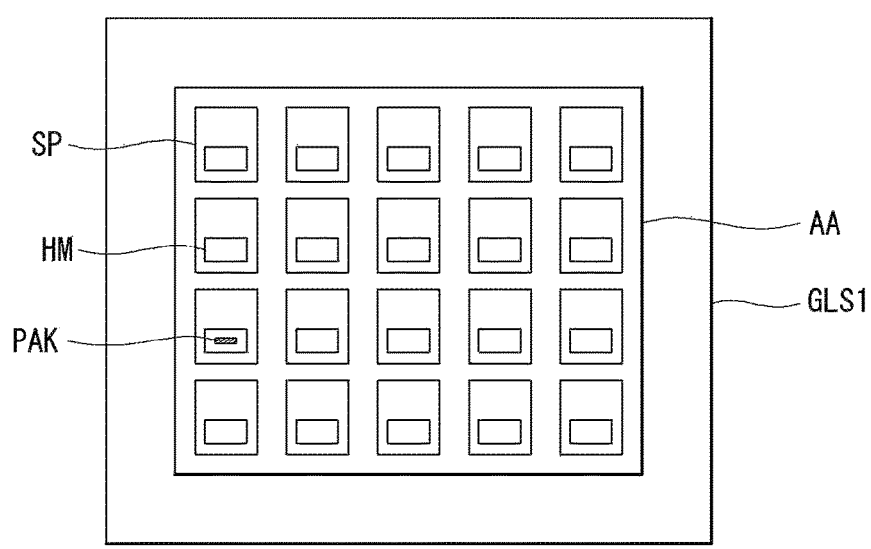
FIG. 19 is a plan view of a display panel manufactured in accordance with a sixth embodiment of the disclosure.
Figure 20:
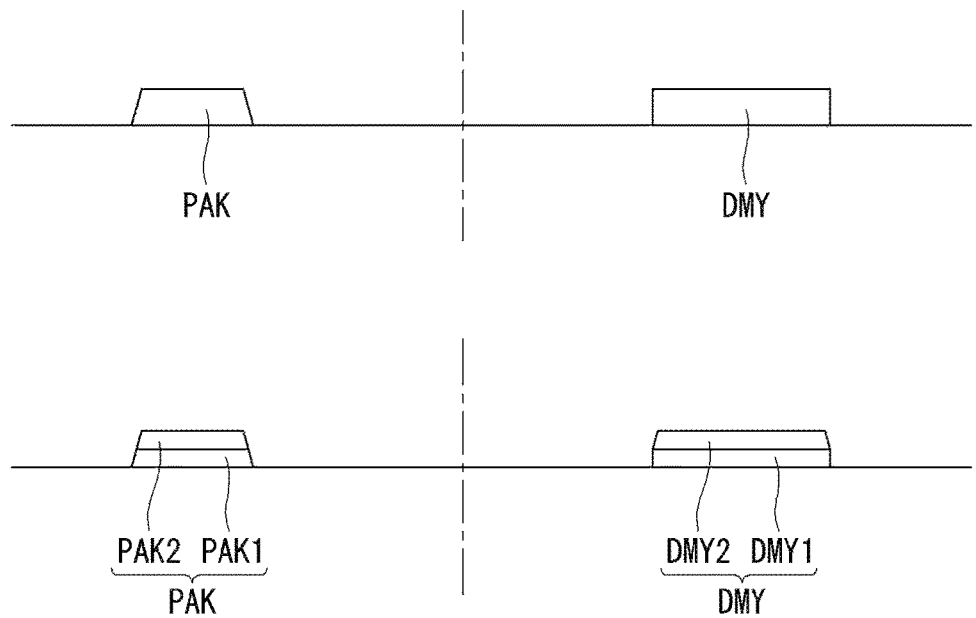
FIG. 20 illustrates a layer structure of each of a fine alignment key and a fine dummy pattern.
Figure 21:
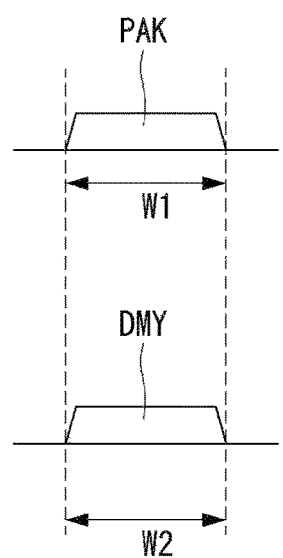
FIG. 21 illustrates sizes of a fine alignment key and a fine dummy pattern.

FIG. 19 is a plan view of a display panel manufactured in accordance with a sixth embodiment of the disclosure. FIG. 20 illustrates a layer structure of each of a fine alignment key and a fine dummy pattern. FIG. 21 illustrates sizes of a fine alignment key and a fine dummy pattern.

As shown in FIG. 19, in the sixth embodiment of the disclosure, a subpixel SP including a fine alignment key PAK inside a keyhole KM and a subpixel SP including only a keyhole KM coexist in a display area AA of a display panel 100.

FIG. 19 illustrates one subpixel SP including the fine alignment key PAK, by way of example. However, embodiments are not limited thereto. For example, the number of subpixels SP including the fine alignment key PAK may be defined as M, where M is an integer equal to or greater than 1. Further, remaining subpixels SP may be subpixels SP including only the keyhole KM. However, embodiments are not limited thereto. For example, the remaining subpixels SP may be a configured such that one or more of the first to fifth embodiments are combined. Namely, at least one subpixel may include a fine dummy pattern.

As shown in FIG. 20, the fine alignment key PAK and a fine dummy pattern DMY may be formed based on a material used to manufacture the display panel 100 and may be formed as a single layer or multiple layers. For example, the fine alignment key PAK may include a first fine alignment key layer PAK1 and a second fine alignment key layer PAK2, and the fine dummy pattern DMY may include a first fine dummy pattern layer DMY1 and a second fine dummy pattern layer DMY2. The layers constituting the fine alignment key PAK and the fine dummy pattern DMY may be formed of the same material or different materials depending on a manufacturing process of the display panel 100.

As shown in FIG. 21, the fine dummy pattern DMY is formed to prevent problems caused by a height difference between the subpixels. Therefore, the fine dummy pattern DMY may have the same size (for example, W1=W2), the same shape, and the same height as the fine alignment key PAK and may be formed of the same material as the fine alignment key PAK.

As the fine alignment key PAK and the fine dummy pattern DMY have the same height, the problems caused by the height difference between the subpixels can be prevented. Thus, it is preferable, but not required, that the fine alignment key PAK and the fine dummy pattern DMY have the similar or same height to the similar or same size or the similar or same shape.

As described above, the embodiments of the disclosure form the four-point alignment structure based on the alignment key disposed outside the target substrate and the fine alignment key disposed inside (i.e., inside the cell where the display area of the display panel will occupy) the target substrate when the ultra-large display device was manufactured, thereby achieving the alignment between the mask substrate and the target substrate. Furthermore, the embodiments of the disclosure can overlap and expose the mask substrates while moving the mask substrates to the left, right, upper, and lower sides based on the fine alignment key. The embodiments of the disclosure can prevent the light leakage using the fine alignment key. In addition, the embodiments of the disclosure can prevent the problems caused by the height difference between the subpixels based on the fine alignment key and the fine dummy pattern.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device having an alignment structure, the display device, comprising:
   a lower substrate layer having an upper surface at a first height;
   a plurality of subpixels layers positioned on the lower substrate layer, the subpixel layers including a plurality of layers of different materials and having an upper subpixel layer having an upper surface at a second height;
   a keyhole positioned within the subpixel layers, the keyhole including a recess that exposes the upper surface at the first height of the lower substrate layer; and
   a fine alignment key layer positioned within the keyhole, the fine alignment key layer being comprised of at least one material layer positioned within the recess, the at least one material layer having an exposed upper surface at a third height that is less than the second height and greater than the first height, the alignment structure exposing the lower substrate layer, the upper subpixel layer and the fine alignment key layer with each having different heights of upper surfaces exposed during alignment.

2. The display device of claim 1, wherein the fine alignment key is positioned in at least one non-opening of the subpixels.

3. The display device of claim 1, wherein the fine alignment key is disposed inside the keyhole in an island shape.

4. The display device of claim 1, wherein the fine alignment key is formed of at least one material formed on the lower substrate.

5. The display device of claim 1, wherein the plurality of subpixels include:
   a subpixel in which the fine alignment key is disposed inside the keyhole; and a subpixel in which a fine dummy pattern is disposed inside the keyhole.

6. The display device of claim 5, wherein the fine alignment key and the fine dummy pattern have the same height.

7. The display device of claim 1, further comprising an upper substrate positioned opposite the lower substrate, the upper substrate including a light leakage prevention layer at a location corresponding to the keyhole.

8. A display device having an alignment structure, the display device, comprising:
- a first substrate layer having a first surface as an upper surface;
- a plurality of subpixel layers positioned on the first substrate layer, the subpixel layers having a plurality of layers of different materials having an upper subpixel layer as a second surface as an upper surface that is above the first surface of the first substrate;
- a keyhole positioned within the subpixel layers, the keyhole including a recess that exposes the first surface as an upper of the first substrate layer; and
- a fine alignment key layer positioned within the keyhole, the fine alignment key layer being comprised of at least one material layer positioned within the recess, the at least one material layer having a third surface exposed as an upper surface that is above the first surface but is below the second surface,
- wherein the alignment structure exposes the first substrate layer, the upper subpixel layer and the fine alignment key layer with different heights of the first surface layer, the second surface of the subpixel layer, and third surface of the fine alignment key layer during alignment.

9. The display device of claim 8 wherein the keyhole is positioned in a dummy region of the display device.

10. The display device of claim 8 wherein the keyhole is positioned in a non-opening region of the display device that does not emit light and the plurality of subpixel layers include at least two color filters of different colors that aligned with one directly above the other.

11. The display device of claim 10 wherein the two color filters are in direct contact with each other.

12. The display device of claim 9, wherein the display device includes:
- an active subpixel in which the fine alignment key is disposed inside the keyhole; and
- a dummy subpixel in which a fine dummy pattern is disposed inside the keyhole.

13. The display device of claim 12, wherein the fine alignment key and the fine dummy pattern have the same height.

14. The display device of claim 12 wherein the active subpixel in which the fine alignment key is disposed includes a light emitting pixel.

15. The display device of claim 12 wherein the dummy subpixel in which the fine dummy pattern is disposed includes plurality of layers disposed on top of each other that not are etched within that subpixel during the various pattern and etching steps and the dummy pixel does not emit light.

16. The display device of claim 15 wherein the plurality of subpixel layers disposed on top of each other include a gate layer in direct contact with a source and drain electrode layer.

17. The display device of claim 15 wherein the plurality of subpixel layers disposed on top of each other include at least two different color filter layers.

18. An alignment structure of a display device, comprising:
- a lower substrate comprised of a first type of material having an upper surface at a first height;
- a subpixel positioned on the lower substrate, the subpixel having a plurality of layers of different materials that includes a second type of material as an upper layer having an upper surface at a second height exposing the second type of material;
- a keyhole positioned within the subpixel, the keyhole being a recess that exposes the first type of material on the upper surface at the first height; and
- a fine alignment key positioned within the keyhole, the fine alignment key being comprised of at least one material layer of a third type of material positioned within the recess, the third type of material layer having an upper surface at a third height exposing the third type of material that is less than the second height and greater than the first height, the upper surfaces of the subpixel, keyhole and fine alignment key exposing three different types of material at three distinct, different heights during alignment.

* * * * *